(12) United States Patent
Fung et al.

(10) Patent No.: US 10,650,175 B2
(45) Date of Patent: May 12, 2020

(54) HYDROCARBON MIGRATION AND ACCUMULATION METHODS AND SYSTEMS

(71) Applicant: Saudi Arabian Oil Company, Dhahran (SA)

(72) Inventors: Larry Siu-Kuen Fung, Dhahran (SA); Shouhong Du, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/256,019

(22) Filed: Jan. 24, 2019

(65) Prior Publication Data

US 2019/0228121 A1    Jul. 25, 2019

Related U.S. Application Data

(60) Provisional application No. 62/621,206, filed on Jan. 24, 2018.

(51) Int. Cl.
*G06G 7/48* (2006.01)
*G06F 30/20* (2020.01)
*G01V 99/00* (2009.01)
*G06F 30/23* (2020.01)

(52) U.S. Cl.
CPC ............ *G06F 30/20* (2020.01); *G01V 99/005* (2013.01); *G01V 2210/644* (2013.01); *G06F 30/23* (2020.01)

(58) Field of Classification Search
CPC .............................. G06F 17/5009; G06F 30/20
USPC ........................................................ 703/10
See application file for complete search history.

(56) References Cited

U.S. PATENT DOCUMENTS

| 5,586,082 | A | 12/1996 | Anderson et al. |
| 8,386,227 | B2 | 2/2013 | Fung et al. |
| 8,433,551 | B2 | 4/2013 | Fung et al. |
| 8,548,783 | B2 | 10/2013 | Dean et al. |
| 9,177,086 | B2 | 11/2015 | Fung et al. |

(Continued)

FOREIGN PATENT DOCUMENTS

| WO | 2012033650 | 3/2012 |
| WO | 2013043158 | 3/2013 |

OTHER PUBLICATIONS

International Search Report and Written Opinion issued in International Application No. PCT/US2019/014688 dated Jun. 26, 2019, 16 pages.

(Continued)

*Primary Examiner* — Hugh M Jones
(74) *Attorney, Agent, or Firm* — Fish & Richardson P.C.

(57) ABSTRACT

Methods for simulating hydrocarbon (HC) migration and accumulation in a subsurface formation are provided. The methods include determining a plurality of HC mass associated with a plurality of grid cells representing the subsurface formation. The methods also include determining a plurality of HC mass outflow magnitudes for one or more grid cells in the plurality of grid cells, the HC mass outflow magnitude for each of the one or more grid cells having an upper bound value based on the HC mass in that grid cell. The methods update the HC mass of the plurality of grid cells based on the plurality of HC mass outflow magnitudes. The methods also determine that a set of grid cells in the plurality of grid cells contain an excess mass of HC, and perform an accumulation process to model filling of a trap associated with the set of grid cells.

20 Claims, 11 Drawing Sheets

(56) References Cited

U.S. PATENT DOCUMENTS

| | | |
|---|---|---|
| 9,754,056 B2 | 9/2017 | Maliassov |
| 2009/0265152 A1 | 10/2009 | Cacas et al. |
| 2010/0257004 A1 | 10/2010 | Perlmutter et al. |
| 2014/0358502 A1 | 12/2014 | Kleine et al. |
| 2016/0298427 A1 | 10/2016 | Kauerauf et al. |

OTHER PUBLICATIONS

Nooruddin et al., "Large-scale invasion percolation with trapping for upscaling capillary-controlled darcy-scale flow," Transport in porous media, Reidel Dordrecht, NL, vol. 121, No. 2, Nov. 28, 2017, 28 pages.

U.S. Appl. No. 62/524,223, filed Jun. 23, 2017, Kayum et al.

Oldenberg et al., "On the use of Darcy's Law and Invasion Percolation Approaches for Modeling Large-Scale Geologic Carbon Sequestation," Greenhouse Gases Science and Technology, vol. 6, No. 1, Feb. 2016, 15 pages.

Hantschel and Kauerauf, "Chapter 6: Fundamentals of Basin and Petroleum Systems Modeling," Springer-Verlag, Berlin, Germany, 2009, 35 pages.

Magoon and Dow, "The Petroleum System: From Source to Trap," AAPG Memoir 60, 1994, 22 pages.

HYDROCARBON MIGRATION AND ACCUMULATION METHODS AND SYSTEMS

CROSS-REFERENCE TO RELATED APPLICATION

This application claims priority under 35 U.S.C. § 119 to U.S. Provisional Patent Application Ser. No. 62/621,206, filed on Jan. 24, 2018, the entire contents of which are incorporated by reference herein.

TECHNICAL BACKGROUND

This disclosure relates to hydrocarbon migration and accumulation methods and apparatus.

BACKGROUND

Basin modeling is a modeling system which is used to track hydrocarbon generation, migration, and accumulation within a sedimentary basin evolution over hundreds of millions of years. Under suitable temperature and pressure conditions, source rocks generate petroleum over basin length and time scale. Expulsion likely occurs sporadically and the release of petroleum may be pulsed in time. The stipulated average rates may be small and of the magnitude of $10^{-14}$ to $10^{-15}$ meters per second (m/s). However, the locally peak flow rates may be much greater. Flow most likely occurs in disconnected filaments of migration pathways, also known as stringers, and may flow through connected larger pores or small scale fractures and faults within the basin carrier beds and reservoir rocks. In such a description, the movement of hydrocarbon would be discontinuous.

Three main methods for modeling hydrocarbon migration has been used: flow-path, invasion percolation, and Darcy-flow method. The problem with flow-path and invasion percolation method is that these methods assume inviscid flow and instantaneous migration. Thus, these methods cannot track compositional variations of hydrocarbon in space and time. Conventional Darcy-flow method can treat viscous flow, but it suffers from severe time step size restrictions due to numerical stability. Thus, conventional Darcy-flow method has been limited only to small models or low resolution simulations.

SUMMARY

The present disclosure describes accelerated methods for hydrocarbon fluid migration and accumulation in basin. In some implementations, migration process between any two adjacent grid cells is modeled by applying multiphase extension of the generalized Darcy's law.

More particularly, innovative aspects of the subject matter described in this specification can be embodied in methods for simulating hydrocarbon (HC) migration and accumulation in a subsurface formation. The method includes the actions of determining a plurality of HC mass associated with a plurality of grid cells representing the subsurface formation. The method also includes determining a plurality of HC mass outflow magnitudes for one or more grid cells in the plurality of grid cells, the HC mass outflow magnitude for each of the one or more grid cells having an upper bound value based on the HC mass in that grid cell. The method updates, with the one or more hardware processors, the HC mass of the plurality of grid cells based on the plurality of HC mass outflow magnitudes. The method also determines that a set of grid cells in the plurality of grid cells contain an excess mass of HC, and in response, performs an accumulation process to model filling of a trap associated with the set of grid cells.

These and other implementations can each optionally include one or more of the following features: at least one grid cell of the trap being filled, the at least one grid cell having a hydrocarbon potential that is less than hydrocarbon potential of neighboring grid cells adjacent to the at least one grid cell, the neighboring grid cells being outside the trap; the HC mass of the plurality of grid cells being updated based on the plurality of HC mass outflow magnitude determined for a time step, the time step being determined based on net efflux and volume of the one or more grid cells; the magnitude of HC mass outflow of a grid cell being determined based on harmonic averaging of transmissibility of the grid cell and neighboring grid cells adjacent to the grid cell; the HC mass of the plurality of grid cells being updated based on the plurality of HC mass outflow magnitude determined for a time step, the time step being determined based on properties of one or more chemical components of the HC; all grid cells in the trap have the same hydrocarbon potential; the hydrocarbon potential being calculated based on a gravity-capillary equilibrium in the trap.

The previously described implementation is implementable using a computer-implemented method; a non-transitory, computer-readable medium storing computer-readable instructions to perform the computer-implemented method; and a computer-implemented system comprising a computer memory interoperably coupled with a hardware processor configured to perform the computer-implemented method/the instructions stored on the non-transitory, computer-readable medium.

The subject matter described in this specification can be implemented in particular implementations to realize one or more of the following advantages. First, no arbitrary adjustment of permeabilities (as cited in traditional methods) is needed; actual permeability of the porous media is used. As a result, the described methodology is more accurate and consistent than conventional methods of simulating migration or accumulation.

Second, the same flow law can be consistently applied to the whole basin with no need to divide grid cells (for example based on their permeabilities) for application of different flow laws (for example, as applied in hybrid and combination methods) is needed.

Third, tracking of any hydrocarbon or chemical composition in time and space is achievable for both migration and accumulation simulations. The migration process between any two adjacent grid cells can be modeled by applying multiphase extension of the generalized Darcy's law, which allows for compositional tracking. Further, migration time and sequence of migration events can be tracked.

Fourth, the analysis has the capability of using full representation of potential gradients (for example, pressure, buoyancy, capillarity) between the two cells without any need for simplification. The method is also capable of using actual transmissibility calculated from a grid cell's actual respective permeability.

Fifth, high resolution and low simulation period is achieved without sacrificing the accuracy. Constraints applied on total mass efflux from a grid cell guarantee numerical stability of the method. Further, the method can determine time step size based on chemical or compositional tracking requirements to optimize the needed time.

Sixth, the present method is capable of performing parallel processing for both migration and accumulation analysis. This feature improves the processing time dramatically. As a result, the present parallel computing method models a high-resolution multi-billion-cell basin migration and accumulation in a few hours instead of taking days and weeks on conventional parallel computing systems.

Seventh, the described methodology can be used by a real-time computing system to dynamically control, or direct control of, tangible equipment based on generated output data, such as a forward stratigraphic model.

Further, from the reservoir engineering point of view, it has been a mystery how and when the oil and gas filled today's reservoirs displacing the resident water. Reservoir engineers often face challenges in initializing large reservoirs. It is not surprising to see high initial water saturations at the crustal locations. In traditional approaches, simulation engineers are often forced to use unrealistic capillary function curves to keep the water at higher elevations far away from the oil water contacts. This traditional approach can cause convergence problems for the reservoir simulator, ending up in small time steps and increased execution times. In addition, heavy oil rims or tarmat zones around the oil water contacts have been difficult to predict; thus, it would be useful to know their locations without drilling wells. The present disclosure provides solutions to these problems.

Moreover, large reservoirs (for example the reservoirs in Middle East) show large variations in oil composition both areally and vertically. It is important to know some critical elements such as hydrogen sulfide, carbon dioxide and monoxide within the reservoir without having to drill wells. Other desired parameters that a basin simulator should predict are inter-well rock property distribution, abnormal formation pressures, salinity variation, tilted contacts. The present disclosure provides solutions for these needs.

Further, the present disclosure provides the geological history of a basin that can be used to find new oil and gas fields. The basin simulator can also be used to predict how much reserves an unconventional oil or gas reservoir may have. The simulator identifies new hydrocarbon accumulations and reduces the drilling cost as well.

The details of one or more implementations of the subject matter of this specification are set forth in the accompanying drawings and the description. Other features, aspects, and advantages of the subject matter will become apparent from the description, the drawings, and the claims.

DETAILED DESCRIPTION

Figure 1:
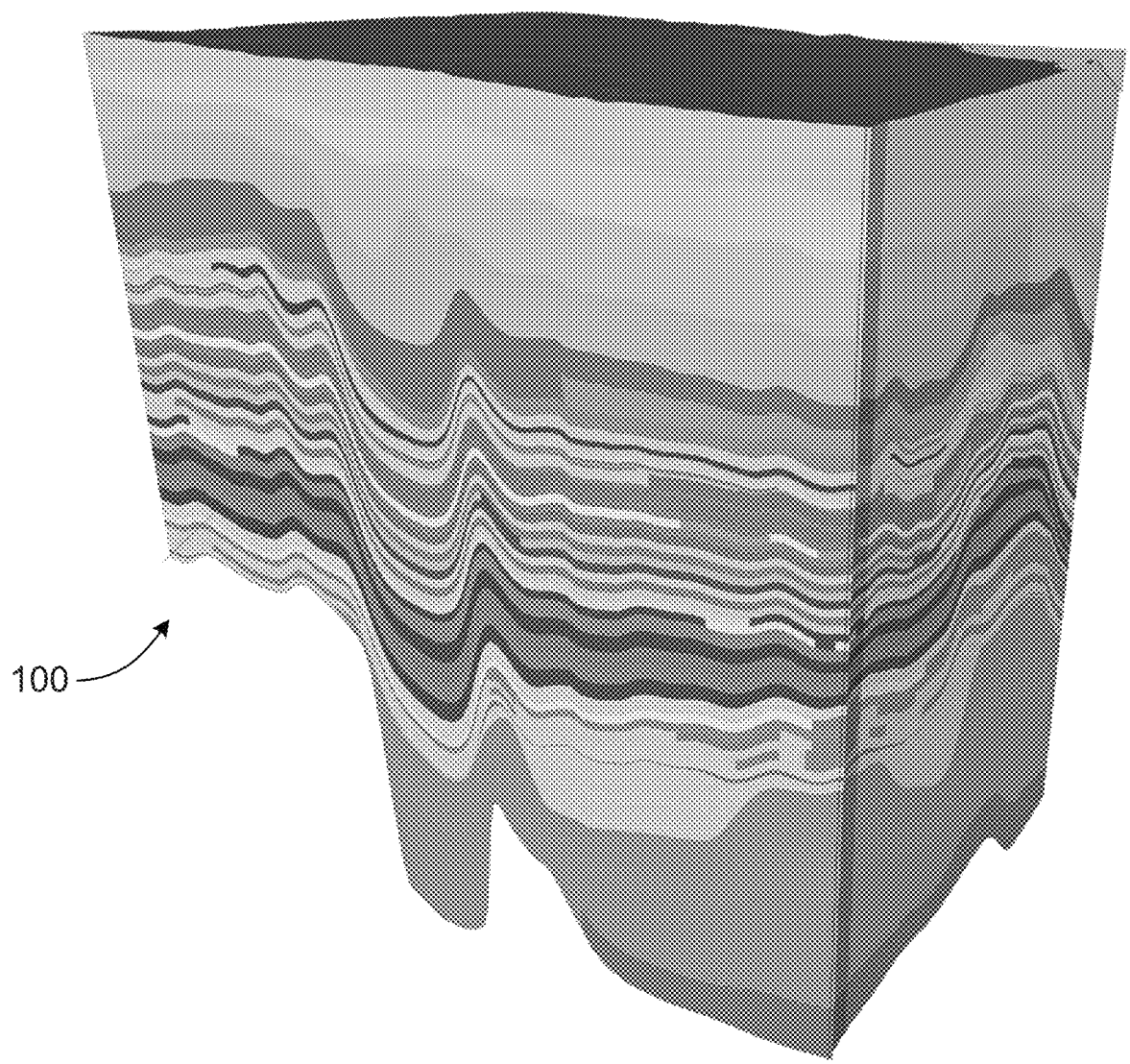
FIG. 1 is a plot illustrating an example of a basin model, according to an implementation.

This disclosure describes an accelerated method for modeling migration and accumulation of hydrocarbon in a basin simulator. In some implementations, the method applies the multiphase extension of the generalized Darcy's law to determine mass fluxes between any two adjacent grid cells for migration processing. The analyses can use the full representation of the potential gradient (for example, pressure, buoyancy, capillarity) between the two cells without simplification. Furthermore, the method can also use the actual transmissibility calculated from the grid cells' respective permeabilities as is without change.

Arbitrary adjustments of permeabilities, as cited in traditional methods, are not needed in this disclosed method. The division into two plurality of grid cells, also cited in traditional methods, in order to apply different flow laws, such as invasion percolation (inviscid flow) for the fast subset and the Darcy's law (viscous flow) for the slow subsets, is also not needed in this disclosed method.

In some implementations, the method discretizes the entire basin model into a plurality of finite volumes or finite elements (referred to here as grid cells) sufficiently refined so as to provide sufficient resolution for fluid migration and accumulation analyses. In some implementations, the method performs migration and accumulation processing during several time steps. In some examples, each time step size is determined based on the desired resolution in time and space.

In some implementations, the method uses Darcy-based calculations to determine hydrocarbon migration. In some examples, the calculations are performed via parallel processing. For example the basin model domain may be divided into subdomains and each subdomain may be assigned to a computer Central Processing Unit (CPU) core for parallel processing.

In some implementations, the method includes a constraint on total mass efflux from a grid cell to be bounded to the mobile accumulated mass in the grid cell. In some examples, at each time step, the method uses an exact mass balance to update hydrocarbon mass for the next time step.

The method also models accumulation of hydrocarbons in a basin simulator. In some implementations, the accumulation processing (for example, backfilling) is triggered when an excess hydrocarbon mass exists in a trap. In some implementations, the accumulation mergers are processed when two or more trap accumulations coalesce into a single accumulation body. The method may complete accumulation processing when all excess hydrocarbon mass in any trap is spent or the trap has reached a spill or a breakthrough condition. In some implementations, the method applies parallel processing to do the backfill calculation.

A computer readable medium is also disclosed. The computer readable medium can store instructions that, when executed by a processor, are configured to cause the processor to perform operations according to the migration or accumulation methods or both. A computer system is also disclosed. The computer system includes a processor and a memory system including one or more computer readable media storing instruction that, when executed by the processor, are configured to cause the computer system to perform operations of the migration or accumulation methods or both.

Basin modeling is a modeling system used to track hydrocarbon generation, migration, and accumulation within a sedimentary basin evolution over hundreds of millions of years. Under suitable temperature and pressure conditions, source rocks generate petroleum over basin length and time scale. The generated hydrocarbon liquids are discharge into carrier rocks in the basin. These mobile hydrocarbon fluids then migrate until they reach a trap within the basin to form present day hydrocarbon reservoirs.

Three main methods have been described in basin modeling systems: the flow-path method, the invasion percolation method, and the Darcy flow method. Additionally, hybrid method (a combination of flow path and Darcy flow) and combined method (combination of invasion percolation and Darcy) have been introduced. However, all these methods have attendant limitations and deficiencies for modeling hydrocarbon migration.

For example, flow-path migration method does not consider time dependency, and migration/accumulation are assumed to be completed instantaneously. It does not depend on the permeability of the medium nor the viscosity of the migrating fluid. Since the permeability can span from over $10^{15}$ orders of magnitudes from several Darcies in fracture rocks to nano-Darcy shale or mud rocks, this assumption may be far from desirable in practical application. Another deficiency is that only gravity potential is treated.

Compared to flow-path method that considers only buoyancy, invasion percolation can take into account both buoyancy and capillarity forces for hydrocarbon movement. Further, invasion percolation can also include the flowing aqueous phase pressure forces (as water is the continuous phase in carrier rocks during the migration process). However, similar to the flow-path method, invasion percolation is deficient in tracking oil movement over time because it assumes an instantaneous flow and independent of permeabilities.

The Darcy's law calculates flow rate of a viscous fluid between two points of a porous medium. It states that the flow velocity between two points is proportional to the potential gradient between the two points. The proportionality constant depends on absolute permeability of the medium and viscosity $\mu$ of the fluid. The potential gradient $\vec{\nabla} \Phi$ is the difference of the potentials at the two points, divided by directed distance between the two points. The potential includes the pressure potential, and the gravitational potential. If more than one fluid phase is present, multiphase extension of Darcy's law can be used. The multiphase Darcy's law additionally includes capillary potential, which is a function of the rock type and the fluid phase saturation; the permeability becomes the effective permeability, which is the product of the absolute permeability k and the relative permeability $k_r$, which is a function of the fluid phase saturation. Accordingly, multiphase extension of the Darcy's law calculates the phase velocity $\vec{v}$ as:

$$\vec{v} = -\frac{kk_r}{\mu}\vec{\nabla}\Phi, \quad (1)$$

where $\vec{v}$ is the phase velocity, k is absolute permeability; $k_r$ is relative permeability; and $\vec{\nabla}\Phi$ is potential gradient.

The advantage of the Darcy-flow method over flow-path method and invasion percolation method is that the migration time and time sequence of migration events can be accounted for. Thus hydrocarbon components can be accounted for and chemical compositions can be tracked through the migration pathways, as well as, the accumulation bodies. In this situation, the hydrocarbon phases are treated as continuous phases, and the effective permeabilities of the media influence the amount of time required to flow the amount of fluids. The permeability in the basin can vary from several Darcies in fractured rocks to nano-Darcies in mud rocks or shales, spanning may be more than $10^{15}$ orders of magnitudes.

The problem of using Darcy's law for basin migration modeling is that the computational cost is greater compared to invasion percolation method or flow-path method. This is because the Darcy time step is controlled by numerical stability considerations and the extreme heterogeneities of the basin rocks imposes severe time-step-size limitation. As a result, typical basin models use coarse grid sizes of about one kilometer in areal dimensions and thickness of a hundred meter for migration analysis, which leads to poor accuracy, compared to what can be afforded in flow-path or invasion percolation methods. Further, the practice of Darcy migration in traditional methods is to adjust permeability values to save computational cost.

Furthermore, an important criticism of a straightforward application of Darcy's law for migration modeling is that Darcy flow is based on the macroscopic view that migration can be represented as being smooth and continuous with average properties. Since expulsion rates from source rocks are typically very small (~$10^{-14}$ m/s) and may occur sporadically over millions of years. Darcy's flow law may not suitably represent the view that migration occurs in disconnected stringers with sharp boundaries at relatively low concentration with sporadic instantaneous spatial jump as oil globs accumulates in stringer tip until large enough to overcome local capillary thresholds in the pore networks. At least, a constant velocity over a time step may be an over simplification of the process Hybrid migration and combined migration methods have been introduced to overcome the identified problems. In both methods the basin is decomposed into two sub-regions: one with high-permeability, and the other with low-permeability. In hybrid migration, flow-path method is applied to the high-permeability region, while in combined migration method invasion percolation is applied to the high-permeability region. Both methods use Darcy calculations for their low-permeability sub-region. Since basin rock can be very heterogeneous permeability in the Darcy flow sub-region may be further adjusted to make time stepping less costly (for example, to speed up the calculation process). However, since each grid cell may have a different permeability, and permeability varies over $10^{15}$ orders of magnitude, this subdivision into two region types and the arbitrary adjustment of permeability to speed up the computation can be a significant deficiency of these approaches. Further, neither of these methods can track chemical composition (such as chemical component concentrations) along migration pathways and the accumulation bodies where the permeability is high (for example, large). In addition, expulsion and migration of hydrocarbons cannot the tracked in either of these methods. Thus, a better method is needed for the more advanced geologic analyses of the migration and accumulation processes.

Further, current commercial implementations of the described methods are limited to serial processing. Due to computational time and cost constraints, most of the model sizes are limited to tens of millions of cells. Recently, a parallel method for invasion percolation migration was disclosed. The method toggles between migration method and accumulation method during migration and accumulation processing. Nevertheless, the key limitation of the method is that it cannot track hydrocarbon composition or chemical concentration variations over time and space. This can include important information for evaluating the origins and evolution of accumulation in the basin. The present disclosure provides capability of simulating a model with multi-billion cells as well as tracking hydrocarbon expulsion and migration over time and space. Embodiments of the present disclosure provide a method for modeling migration and accumulation in a basin model domain. The basin model domain in accordance with the present disclosure is decomposed into several subdomains to conduct parallel basin simulation. FIG. 1 is a plot illustrating an example of a basin model 100, according to an implementation. The basin model 100 includes several sedimentary layers. Each color in the basin model 100 represents a different rock facies. The model 100 may contain hundreds of facies. Permeability of the facies may vary from several a nano-Darcy to several Darcies. The present disclosure handles the full range of variation on rock properties and facies types.

Figure 2:
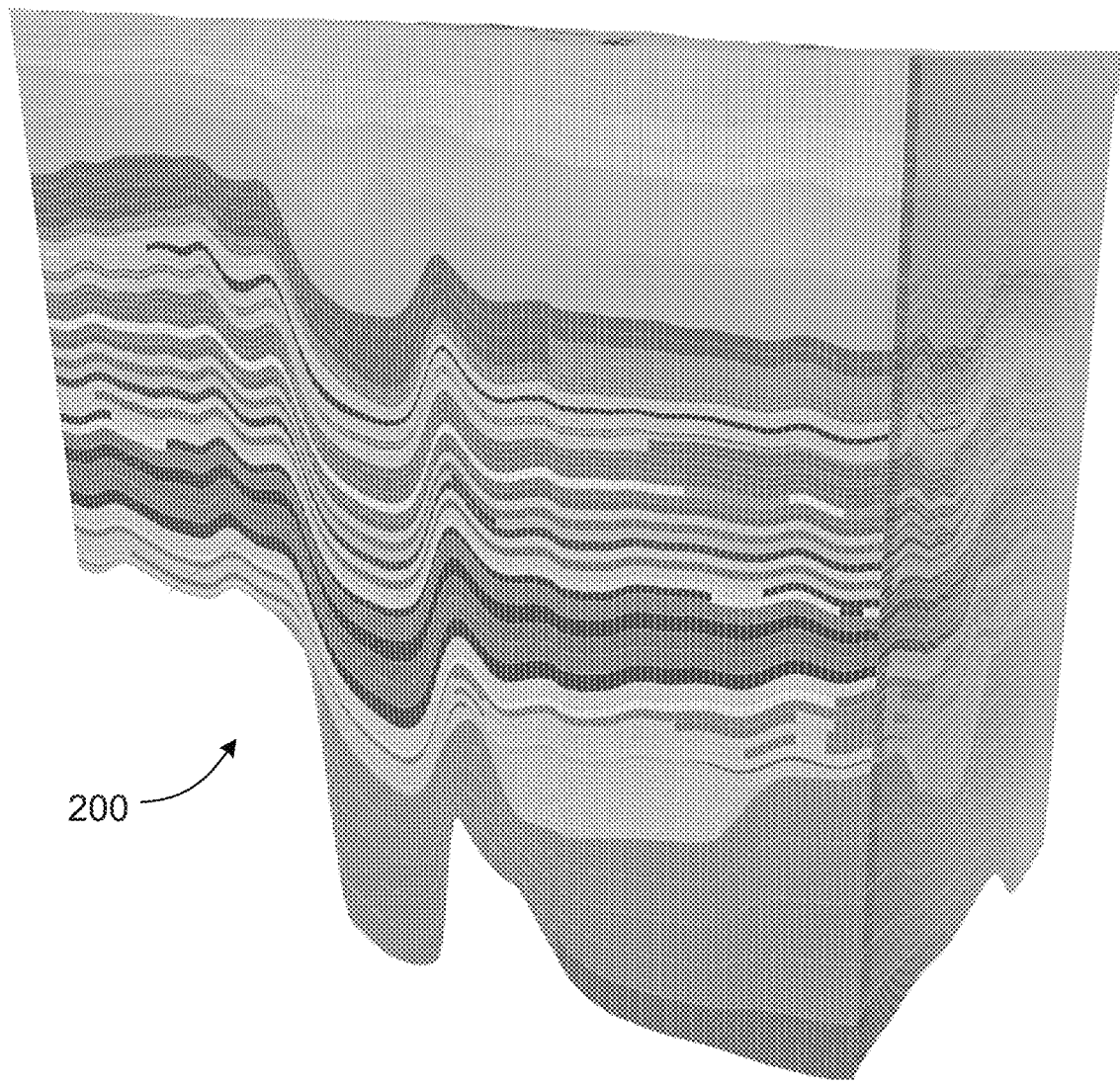
FIG. 2 is a plot illustrating an example of a basin model discretized into grid cells, according to an implementation.

FIG. 2 is a plot illustrating an example of a basin model discretized into grid cells, according to an implementation. Discretized model 200 divides a basin model (for example, basin model 100) into grid cells. In some implementations, the number of grid cells depends on desired or sufficient resolution needed for large regional basin migration modeling. For example, the model 200 may contain from thousands to billions of grid cells. In some implementations, the basin domain is decomposed into several subdomains for parallel processing. In some implementations, the migration processing may be simulated in parallel processing by engaging a group of computational units, with each unit processing a subdomain of grid cells. In some examples, a unit may process multiple subdomains. In some implementations, the grid size can be refined. For example, a grid size can be about 100 meters (for example horizontally) and 10 meters (for example vertically).

In some implementations, the migration modeling method of the present disclosure is performed at a migration module (the "module"). In some implementations, the migration module is a part of a basin modeling system. In some examples, the basin modeling system can simulate hundreds of millions of years of the basin's sedimentary evolution. In some examples, the modeling system simulates the generations, migration, or accumulation of hydrocarbon in the basin or all three. Besides the migration module, the modeling system may include modules for accumulation, backstripping, deposition and erosion, pressure solve, temperature solve, or kinetic calculation, or a combination of these.

The migration modeling method performs the simulation period on time steps. In some implementations, the migration flux of hydrocarbon may be evaluated in a sequence of several time-steps. The time step is determined based on the accuracy considerations. For example, the time step may be determined based on the needed resolution in time and space. In some implementations, the time step size is determined based on the expulsion mass rates from source point or the net efflux (or both) to cell volume ratio of the grid cells that contribute in with hydrocarbon migration. In some implementations, the time step size may be uniform, while in other implementations, it may vary for each time step. For example, if hydrocarbon expulses from two source rocks, the time step size may vary depending on the time and rate that each source is active. Depending on the accuracy requirements and computational efficiency, a time step size can be less than one year to more than a million years.

Contrary to traditional methods, the methods of the present disclosure do not need an alteration of actual permeability field (as was done in traditional methods). Further, the maximum hydrocarbon efflux in a time step from a grid-cell is constrained to the hydrocarbon accumulation in the cell at a prior time step. As such, the outflow rate for even high-permeability cells can vary (be non-constant) from one time step to the next time step. Thus, regardless of whether a cell has a high or a low permeability, the outflow rate can be non-constant and the cell reaches a temporary "pseudo" steady state at each time step. Such a constraint also provides an greater-than-zero lower bound on hydrocarbon saturation.

Additionally, according to the methods of the present disclosure, at least at accumulated regions (or traps), the aqueous phase is a continuous phase in water zone. Further, the aqueous phase potential does not need updating during the migration processing. In some examples, the potentials in the water zone are kept unaltered during the migration processing.

Furthermore, the pressure fields within the traps are locally updated to satisfy constant hydrocarbon potential condition within the traps during the accumulation processing. In some implementations, the hydrocarbon phase potentials (oleic or gaseous, or both) in accumulated regions are constant within the oil zone, the gas zone, or both, of the trap, and are updated during each sub-steps of the accumulation processing.

In some implementations, migration modeling method calculates mass efflux of grid cells for the duration of a time step (for example, for each time step). In some implementations, the calculation mass efflux is performed on all grid cells, while in some implementations it is performed only for a group of the cells (for example, the cells that are involved in hydrocarbon migration). In some implementations, the mass efflux is determined for each face of a grid cell. In some implementations, the efflux is calculated based on the invasion percolation method. For example, the invasion percolation method assumes inviscid flow and treat the non-wetting phase motion to be primarily determined by the gravity and capillarity balance. In some implementations, the efflux is calculated based on Darcy's law. In some examples, multiphase Darcy's law may be used. In some examples, the method may utilize the multiphase-flow of the Darcy's law for grid cells, by considering fluid and rock-fluid parameters such as the potential gradients including any of the contributing components, such as pressure, gravity, capillarity, viscosities, effective permeabilities, or other components. In some implementations, the efflux of the basin is partly calculated by invasion percolation and partly by Darcy's law. In some implementations, the efflux calculations of the basin are performed in a parallel fashion.

Figure 4:
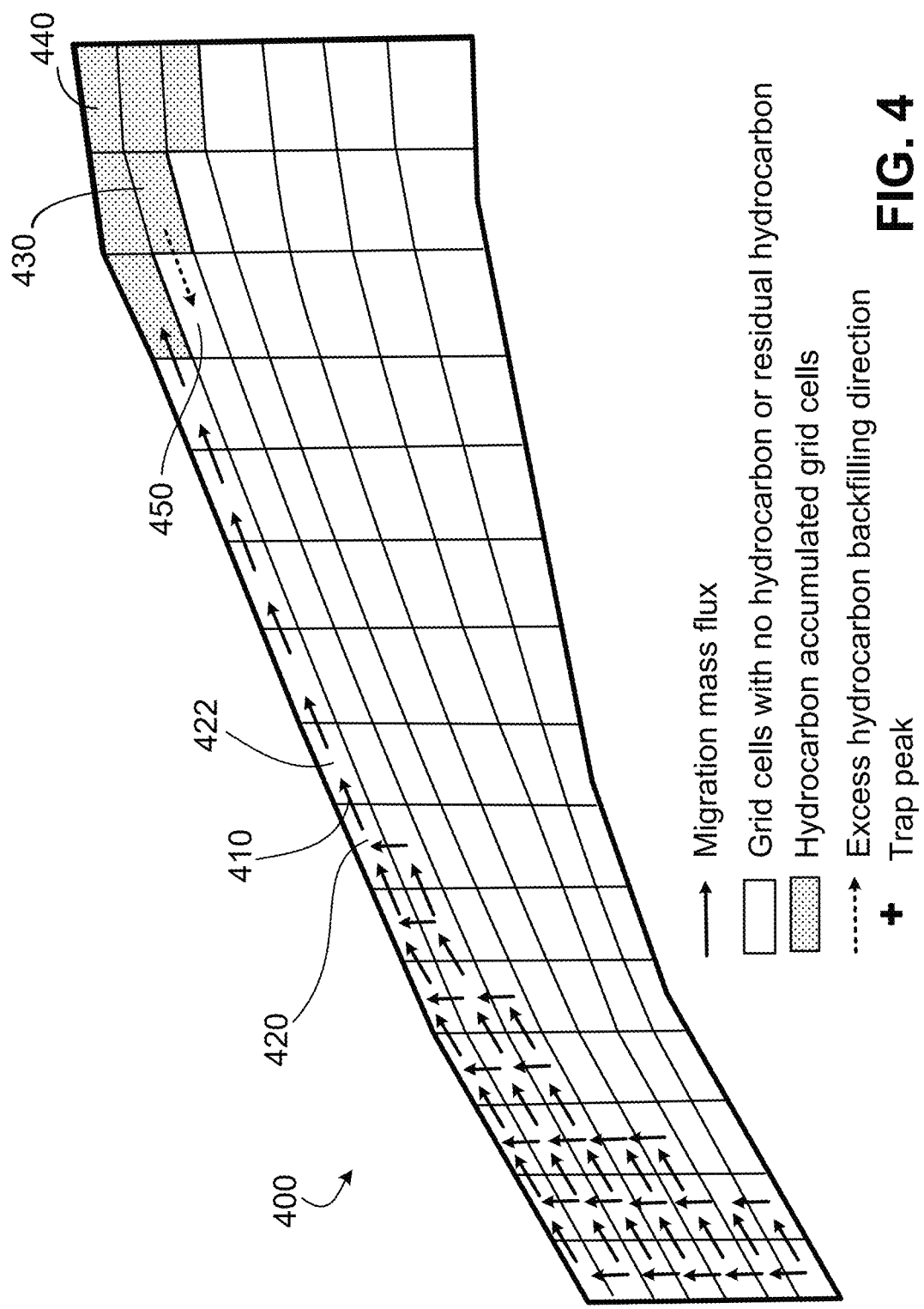
FIG. 4 is a sketch illustrating migration and accumulation in a set of grid cells, according to an implementation.

FIG. 4 is a sketch illustrating migration and accumulation in a set of grid cells 400, according to an implementation. As illustrated, not all cells of the grid cells 400 are actively involved in the migration process at the particular time depicted in FIG. 4. In the depicted example, a migration process between cells 420 and 422 involves a migration mass flux 410. The mass flux 410 may flow through one or more faces of the cell 420 to get to its neighboring (for example, adjacent) cells. A hydrocarbon flow may migrate from a source rock to a trap, where it forms hydrocarbon reservoir. In some basins, a trap is sealed by cap-rocks which have large capillary potential and block leakage of mobile fluid underneath. Each trap has a trap peak (440), where hydrocarbon accumulation starts. In some implementations, the trap peak has a hydrocarbon potential value lesser than all of its adjacent cells. In some implementations, once a cell (430) in the trap has enough hydrocarbon, hydrocarbon mass backfills to the least resisting neighboring cell (450).

Mass flux depends on rock properties, such as effective permeability, and fluid properties, such as viscosity ($\mu$) and density ($\rho$). In some implementations, the flux also depends on relative permeability and capillary pressure, which are multiphase saturation dependent properties. In some implementations, a gird cell's geometry (which is used in a finite-volume discretization scheme for a mass conservative time stepping method) also plays a role in the respective mass flux. In some examples, the grid cell geometry, depth, and permeability are used to compute the transmissibility of a connecting face shared by two adjacent grid cells. For example, the mass flux of a hydrocarbon component i in fluid phase p for a cell connecting face jk between cell j and cell k may be calculated by:

$$q_{ip,jk} = T_{jk+1} \cdot \lambda_{p,jk+1/2} \cdot (\Phi_{pk} - \Phi_{pj}) \tag{2}$$

where $\Phi_{pj}$ is the potential of cell j at phase p; and the mobility term h is upstream weighted, based on potential difference between cells j and k:

$$\lambda_{p,jk+1/2} = \left(\frac{x_i \rho_p k_{rp}}{\mu_p}\right)_{jk+1/2,up}, \tag{3}$$

where $x_i$ is the fraction of component i; $\rho_p$ is the hydrocarbon phase density; $k_{rp}$ is the phase relative permeability; and $\mu_p$ is phase viscosity. In this example, $x_i$ is calculated as the number of moles of component i, divided by the total number of moles of all components in the grid cell. In some implementations, transmissibility is computed using harmonic average of the half transmissibility of cells j and k:

$$T_{jk+1/2} = \frac{T_j T_k}{T_j + T_k}, \tag{4}$$

where Tj is the half transmissibility for cell j and is calculated as:

$$T_j = \frac{A_k k_j}{D_j}, \tag{5}$$

where Aj is the overlapped cell-face area for cell j of connection jk; and Dj is the directed distance from cell center j to cell face for the connection jk. The half transmissibility for cell k may be computed analogously.

The time step size is determined based on mass flux of the grid cells. In some implementations, a time step size is limited to an upper bound.

For example, in some of the implementations that involve component tracking, the upper bound is the minimum of all upper bounds for local time step sizes:

$$Dt_{selected} = \min(Dt_{ip,j}) \tag{6},$$

where $Dt_{selected}$ is the upper bound for the time step size (or is the time step size in some examples), and $Dt_{ip,j}$ is an upper bound for a local (at cell j) time step size for a hydrocarbon component i in fluid phase p for a cell j. Following equation (2), the net mass flux of a hydrocarbon component i in fluid phase p for a cell j is calculated by:

$$q_{ip,j} = \Sigma_k q_{ip,jk} \tag{7}.$$

A positive net mass flux $q_{ip,j}$ indicates that cell j has net inflow for the next time step. In some examples, concentration of hydrocarbon component i is limited to not exceed a threshold value (for example, 1). In these examples, a local time-step size has an upper bound $Dt_{ip,j}$ that can be formulated as:

$$Dt_{ip,j} = \frac{(1-x_i)P_V \rho_p}{q_{ip,j}}, \tag{8}$$

wherein $x_i$ is the fraction of component i; $\rho_p$ is the hydrocarbon phase density; $P_V$ is the pore volume. A negative net mass flux $q_{ip,j}$ indicates that cell j has net outflow for the next time step. In some examples, concentration of hydrocarbon component i is limited to be greater than a threshold value (for example, zero). In these examples, a local time-step size has an upper bound that can be formulated as:

$$Dt_{ip,j} = \frac{x_i P_V \rho_p}{-q_{ip,j}}. \tag{9}$$

In some implementations that do not involve component tracking, for cell j, the net flux for all the hydrocarbon in phase p is calculated as:

$$q_{p,j} = \Sigma_i q_{ip,j} \tag{10}.$$

If the net mass flux $q_{p,j}$ is positive, the local time-step size upper bound $Dt_j$ is calculated by:

$$Dt_j = \frac{(S_{max} - S_p)P_V \rho_p}{q_{p,j}}, \tag{11}$$

where $S_{max}$ is the maximum possible phase saturation; $S_p$ is the current phase saturation. If the net mass flux $q_{p,j}$ is negative, the local time-step size upper bound $Dt_j$ is calculated by:

$$Dt_j = \frac{(S_p - S_{min})P_V \rho_p}{-q_{p,j}}, \tag{12}$$

where $S_{min}$ is the maximum possible phase saturation. Then the upper bound of a selected time-step size (or size of the time step) is calculated as the minimum of all the local time-step size, which is $$Dt_{selected} = \min(Dt_j) \tag{13}.$$

In some implementations, one or more constraints are applied to the mass flux of a cell to let the cell reach a steady state at a time step (for example, at each time step). In some examples, the total mass efflux from a grid cell in a time step is limited to an upper bound. In some examples, the total mass efflux from a cell may be limited to the hydrocarbon mass in that cell at the beginning of the migration time step. In some examples, the total mass flux of a cell may be bound to the reducible mass in the cell. For example, if the time size is such that the total hydrocarbon mass outflow from a cell is equal to reducible hydrocarbon mass in the cell, then the cell is deemed to have reached a pseudo steady state. In this example, if the time required to flow the reducible cell mass is less than the prescribed time step size, the maximum outflow may be constrained to the hydrocarbon mass of the cell minus the irreducible hydrocarbon mass of the cell.

In some implementations, a reducible hydrocarbon mass of a cell is the hydrocarbon in the cell which may flow. In some examples, a cell's reducible hydrocarbon mass, $M_{or}$, is calculated by difference of oil saturation, $S_o$, and irreducible oil saturation, $S_{oi}$, multiplied by grid cell pore volume, $V_b$, multiplied by oil density, $\rho_o$.

$$M_{or} = V_b \phi \rho_o (S_o - S_{oi}) \tag{14}$$

A cell's reducible hydrocarbon is the cell's hydrocarbon mass minus the cell's irreducible hydrocarbon mass. In some examples, a cell's irreducible hydrocarbon mass is the immobile residual oil saturation which cannot be depleted from the cell; it can be calculated by multiplication of oil saturation, cell's pore volume, and oil density.

In some examples, the reducible hydrocarbon mass is not a preset value and needs to be calculated for each time step based on the oil saturation at that time step. In some examples, the irreducible hydrocarbon mass for each grid cell is a preset value. In some examples, each cell may have a different irreducible oil saturation from other cells in the grid.

In some implementation, the outflow mass is allocated to the outflow faces of the grid cell, proportionately. For example, the mass outflow of an outflow cell face may be set proportional to the transmissibility of that face. For any grid cell, the migration mass flux may be completed in one time step, or in several time steps, depending on the effective permeability, fluid viscosity, potential gradients into and out of the cell, or other parameters.

After migration calculations for each time step are performed, the hydrocarbon mass of the grid cells are updated. In some implementations, mass of all the grid cells are updated, while in some other implementations mass of only some of the grid cells (for example, the ones that contributed in hydrocarbon migration) is updated. In some implementations, an exact mass balance method (for example, as applied to finite-volume calculations) is used to calculate the new mass (for example, update the mass). In some examples, the new hydrocarbon mass in a cell at the end of a time step is the old hydrocarbon mass at the beginning of the time step plus sum of the mass inflow of all inflow cell faces minus sum of the mass outflow of all outflow cell faces. In some implementations, one or more hydrocarbon component and chemical species (such as chemical component concentrations) can be tracked. For example, the updated mass, M, for component i in cell j may be calculated by:

$$M_{i,j}^{N+1} = M_{j,j}^{N} + \Delta t \cdot (\Sigma_{k \sqrt{neighbours}} q_{i,jk} + S_{i,j}) \tag{15},$$

where Si,j is a source term (for example, a source rock, if present) of component i in grid cell j. In some implementation, the mass balance is exact; meaning that the mass outflow trough a face of a cell is exactly the mass inflow into its neighboring grid cell that shares the face. In some implementations, net cumulative loss of hydrocarbon mass at the external boundaries of the model (where hydrocarbon may leave the external boundaries of the simulation domain) is also tracked to determine global mass balances. The remaining mass accumulated in the traps can be determined by cumulative hydrocarbon mass generated by the source rocks minus the cumulative hydrocarbon loss at the external boundaries, and other losses.

In some implementations, chemical processes and reactions, solute deposition, solid dissolution, as well as fluid phase equilibrium considerations can be included for advanced geological modeling.

In some implementations, cells are checked to determine whether one or more cells have excess hydrocarbon mass. In examples, the excess mass is the mass that needs more volume than the pore volume of the cell. In some examples, only the cells in accumulated traps are checked for excess mass. In some implementations, a determination is made on whether any new hydrocarbon accumulation has been initiated or any existing hydrocarbon accumulation receives new hydrocarbon mass in the time step.

In some implementations, the method performs an accumulation modeling if one or more cells are identified as containing excess hydrocarbon mass. In some implementations, an accumulation module performs the accumulation modeling. In some implementations, the accumulation and the migration modules work in parallel or series. In some implementations, the accumulation and the migration modules are two parts of a larger unit, for example, a migration/accumulation module. In some implementations, the accumulation module distributes the excess mass until volume balance is restored in the cells. If no cell with excess mass is detected, the migration modeling method determines the next time step and performs its calculations and modeling until the whole simulation period modeled.

In a multicomponent multiphase flow in porous media, each of the grid cells have a certain pore volume, which at a certain pressure and temperature, can hold a certain mass of the said fluid(s). While fluid flows into and out of each of these small units, the numerical scheme must conserve both mass and volume, both globally and locally. Local conservation refers to the balance for each of small unit (for example, finite-volume) so that the net inflow into a finite-volume must equal the net increase in mass in that volume during that time step, and that the mass accumulated in the finite-volume must fit inside the pore volume of that finite-volume. Global conservation is achieved if the sum total of the mass at the new time after taking a time step is very close (within some tolerance) as the total mass at the old time.

In some implementations, once the accumulation module starts, the accumulation continues until a mass/volume balance is satisfied (for example, at each cell, at the overall simulation domain (or grid), or both). In some examples, the accumulation continues until the mass/volume balance is satisfied at each trap. In some implementations, the accumulation comprises a backfilling process, which happens when the excess hydrocarbon mass arrives at an accumulating trap or trap peak with a hydrocarbon potential value lesser than all of its adjacent cells. In some examples, the potential value of more than one hydrocarbon phase can be involved. In some examples, the hydrocarbon phase potential of a cell is equal to gravitational potential of that cell plus capillary pressure of the hydrocarbon phase.

In some implementations, backfilling process first overcome the least resisting neighboring cell (one or more adjacent cells with the lowest hydrocarbon potential). This process continues until all the excess mass is spent, or a spill or a breakthrough point of the trap is reached. If a spill or a breakthrough point is reached, the remaining excess hydrocarbon mass can migrate from the spill point (or breakthrough point) to another trap.

Figure 5:
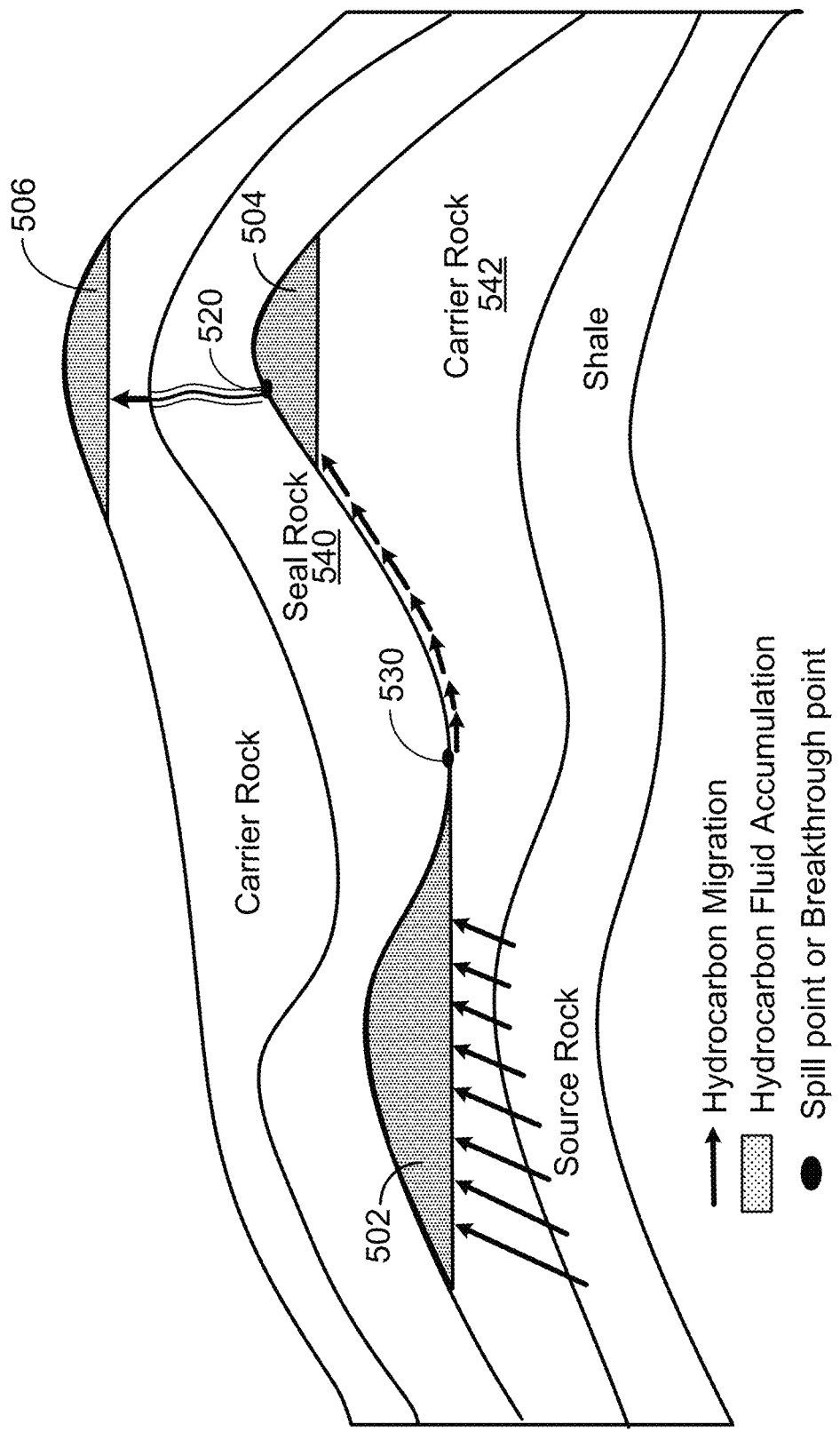
FIG. 5 is a sketch illustrating breakthrough and spilling, according to an example.

FIG. 5 is a sketch illustrating breakthrough and spilling, according to an example. Three accumulating traps 502, 504, 506 are illustrated. A breakthrough (also called seal breakthrough) may occur if the hydrocarbon potential of an accumulated cell at the reservoir seal boundary (for example, at trap 504) gets large enough to overcome capillary entrance pressure of the local seal rock (for example at breakthrough point 520). In some implementations, each grid cell in the basin is assigned to a capillary entrance pressure. When breakthrough happens, excess hydrocarbon leaks through the breakthrough point (or site). In some examples, the hydrocarbon leakage of a breakthrough point at the seal leads to hydrocarbon migration into the seal rock (540). A spill condition occurs when excess hydrocarbon from a trap invades a grid site (for example at spill point 530) and flow into a neighboring cell with a hydrocarbon potential less than that of the spill point. In some implementations, the numerical treatment of the leakage process through a spill point is similar to that of the breakthrough point. In some examples, permeability of the seal rock (540) may be lesser than permeability of carrier rock (542), leading to smaller leakage rate in breakthrough than in spilling.

Figure 6:
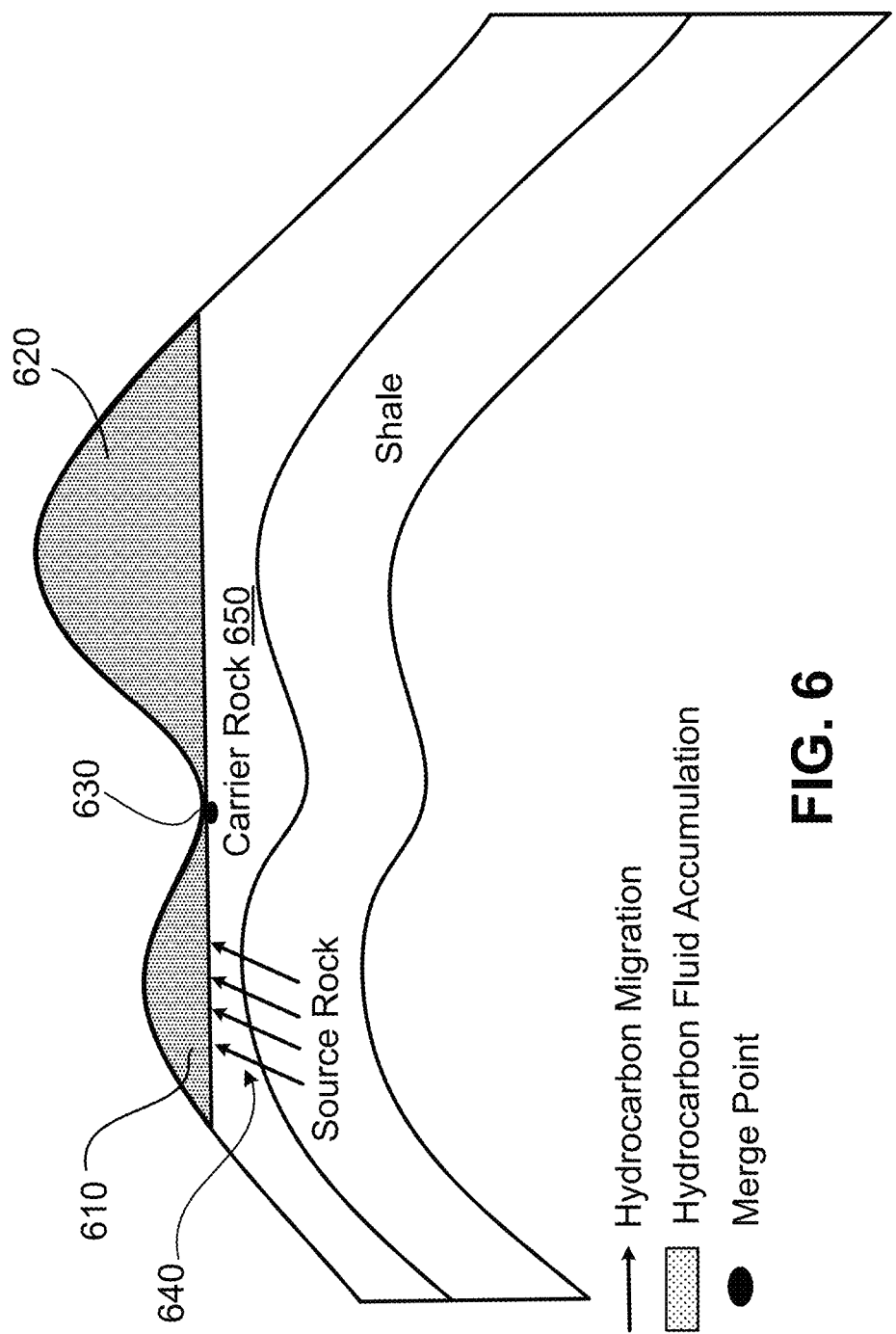
FIG. 6 is a sketch illustrating the merge of two accumulating bodies, according to an example.

In some examples, in a backfilling process, two or more accumulation bodies (for example, traps) may merge to form a larger trap. In some examples, all the contiguous backfilled cells within a trap plus the trap peak form an accumulation body. FIG. 6 is a sketch illustrating the merge of two accumulating bodies, according to an example. As illustrated, accumulating body 610 and accumulating body 620 are on the verge of merging at merge point 630. For example, excess oil may be invaded from trap 610 and being fed into trap 620 via the merging point 630. The excess oil may be fed into the trap 610 by migrating fluxes 640. The migrating fluxes 640 are provided by carrier rocks 650 associated with cells neighboring trap 610. The carrier rocks 650 may get the migration fluxes from their neighboring cells, or may include source rocks that produce hydrocarbons.

In some implementations, the accumulation modeling method applies one or more constraints on the accumulation bodies. In some examples, cells in an accumulation body are in gravity-capillary equilibrium. A multiphasic fluid, oleic and aqueous, gets to an equilibrium condition when phase potential of mobile fluid(s) at a point in the media is in equilibrium with another point (with equal phase potential), and no fluid flow occurs between the two points. In some examples, there is no fluid movement within an accumulated body. In some examples, an accumulated body is associated with a single trap-hydrocarbon-potential calculated and updated based on the equilibrium condition. In some examples, all grid cells within the accumulated body (for example, a trap) and in the equilibrium condition have a hydrocarbon potential equal to the trap-hydrocarbon-potential. In some implementations, accumulation modeling continues until all accumulating traps either have spent (for example by backfilling) all the excess hydrocarbon, or that either a spill or a breakthrough condition has been reached.

Figure 3:
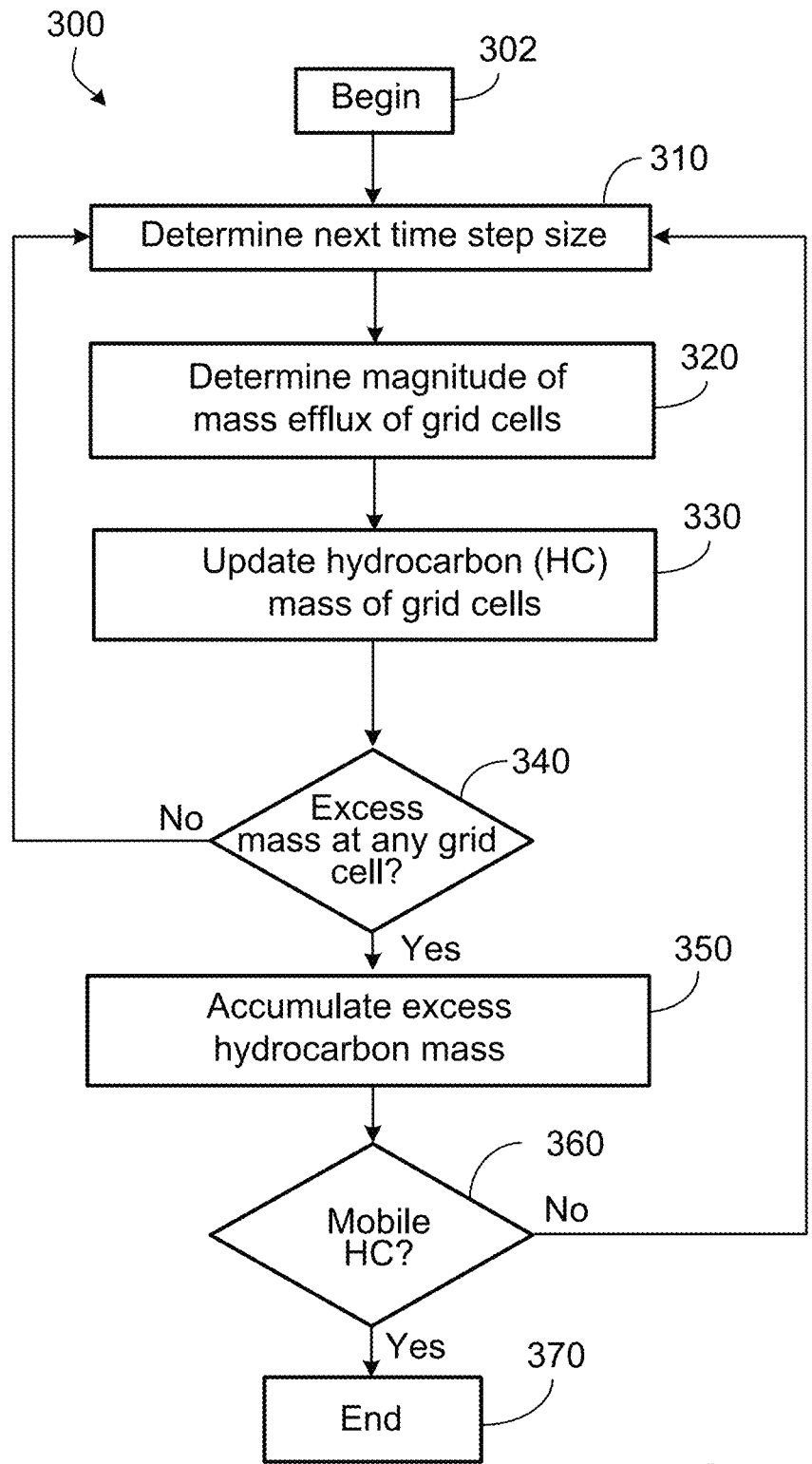
FIG. 3 is a flow diagram illustrating migration and accumulation modeling method, according to an implementation.

Turning to FIG. 3, FIG. 3 is a flow diagram illustrating migration and accumulation modeling method 300, according to an implementation. For clarity of presentation, the description that follows generally describes method 300 in the context of the other figures in this description. However, it will be understood that method 300 may be performed, for example, by any suitable system, environment, software, and hardware, or a combination of systems, environments, software, and hardware, as appropriate. In some implementations, various steps of method 300 can also be run in parallel, in combination, in loops, or in any order.

At 302, the migration and accumulation modeling method begins. For example, the method may begin by another module of a computing system (for example system 820) calling a migration module, or a migration/accumulation module. At 302, the migration or migration/accumulation module launches.

At 310, a time step size is determined. For example, the time step size may be determined based on accuracy criteria submitted by a user, or according to a default accuracy requirement by on the system. In some implementations, the time step size is determined according to the physical properties of the modeled basin or chemical properties (or both) of the targeted hydrocarbon (or hydrocarbon components). In some implementations, the time step is determined based on the mass flux of the hydrocarbon, according to equations (2-13).

At 320, mass efflux of grid cells is calculated. For example, the mass efflux can be calculated by equation (2). The mass efflux is calculated for the time step size determined in 310. In some implementations, the mass efflux is calculated for each faces of the grid cells. In some implementations, the mass efflux is calculated for one or more hydrocarbon components.

At 330, hydrocarbon mass of grid cells are updated. In some implementations, the new hydrocarbon mass in a cell equals the hydrocarbon mass of the cell at the beginning of the time step, plus inflow mass into the cell during the time step, minus outflow mass from the cell in the time step. In some implementations, an exact mass balance method (for example, equation by (15)) is used for the hydrocarbon mass calculations.

At 340, a determination is made on whether a cell has excess mass. In some implementations, the excess mass determination is performed only on trap cells. In some examples, an excess mass is detected when more hydrocarbon mass is assigned to a cell than the cell's pore volume can encompass. In some implementations, at 340 it is determined whether any new hydrocarbon accumulation has been initiated or any existing hydrocarbon accumulation receives new hydrocarbon mass in the time step.

If no excess mass is detected, next migration time step is determined for the next migration round. However, if an excess mass is detected, the method proceeds to 350.

At 350, excess hydrocarbon mass is accumulated. In some implementations, 350 is performed on an accumulation module, meaning that the migration module initiates an accumulation module upon detecting excess mass. In some implementations, the accumulation module and the migration module are two parts of one module. In some implementations, 350 includes all accumulation scenarios, including backfill, merging trap, detecting spill, and detecting breakthrough, in its calculations. In some implementations, 350 performs methods and calculations, in parallel or series, until the accumulated hydrocarbon mass and volume is conserved. In some implementations, 350 continues until all accumulating traps either have spent all the excess hydrocarbon, or that either a spill or a breakthrough condition has been reached.

At 360, cells are checked for any mobile hydrocarbon. For example, a cell may belong to no trap, but have mobile hydrocarbon mass. If mobile hydrocarbon is detected, a next time step size will be determined (going back to 310) to continue the simulation until the simulation period is completed. Otherwise, the accumulation ends and the results are returned (370). In some implementations, the accumulation module returns its results to other software modules of the basin simulator.

In one implementation, first a time step size for migration to provide sufficient resolution in time and space is calculated. Then each mass flux of each face for each grid cell for this selected time step size is computed using Darcy's law. The mass at new time is updated using the exact mass balance method, as applied to a finite-volume calculation. Upon determining that excess hydrocarbon mass at the new time level exists (in any accumulating traps) the accumulation process starts. The accumulation includes backfilling process that form hydrocarbon traps. The migration process ends when all the mass have migrated to the traps or leaked through basin boundary.

In contrast to traditional techniques that perform accumulation in a serial (or single) process, accumulation performed according to the present disclosure is performed in parallel processes. In some implementations, when hydrocarbon mass reaches a trap and joins the mass in the trap more volume than the trap's volume is required for containing both masses. The process of accumulation or backfilling is the process of determining the boundary cells that the excess mass needs to invade (annex); such that the total hydrocarbon mass will fit inside the new trap volume with the annexed additional grid cells. The mass and volume conservation are achieved within each migration time step. In some implementations, during a migrate time step, mass is always conserved. When hydrocarbon mass enters a trap (which is a collection of contiguous cells filled with hydrocarbon), the accumulation processing restores the volume balance in the trap. Accordingly, two or more adjacent traps can coalesce to form a bigger trap, or hydrocarbon may spill if a spill-point or a breakthrough-point is reached during the accumulation processing. Using the present techniques, large scale basin with more than 1 billion grid cells can be modeled.

In some implementations, the migration and accumulation models are associated with tolerances (for example thresholds on size or time) below (for example, lesser than) which the method considers no migration or accumulation (or both) to be happening and ends the process. For example, if the detected mobile hydrocarbon at 360 is less than a migration threshold, the accumulation module ends the process and returns its results. In some implementations, the migration and accumulation modules are two parts of one module (for example migration/accumulation module). In some implementations, the migration module is separate from, but in communication with the accumulation module.

Similar to the migration processing, accumulation processing may be performed via serial processing or parallel processing. In some implementations, the basin model is decomposed into multiple subdomains for parallel processing. Each subdomain may own a subset of the basin domain's grid cells. One object of the present disclosure is to reduce parallel communication overheads through number of strategies, including communication hiding by overlapping computation with communication, reducing data needed for communication, and associating subdomain layouts with processing cores and nodes to reduce needed memory hopes.

Figure 7:
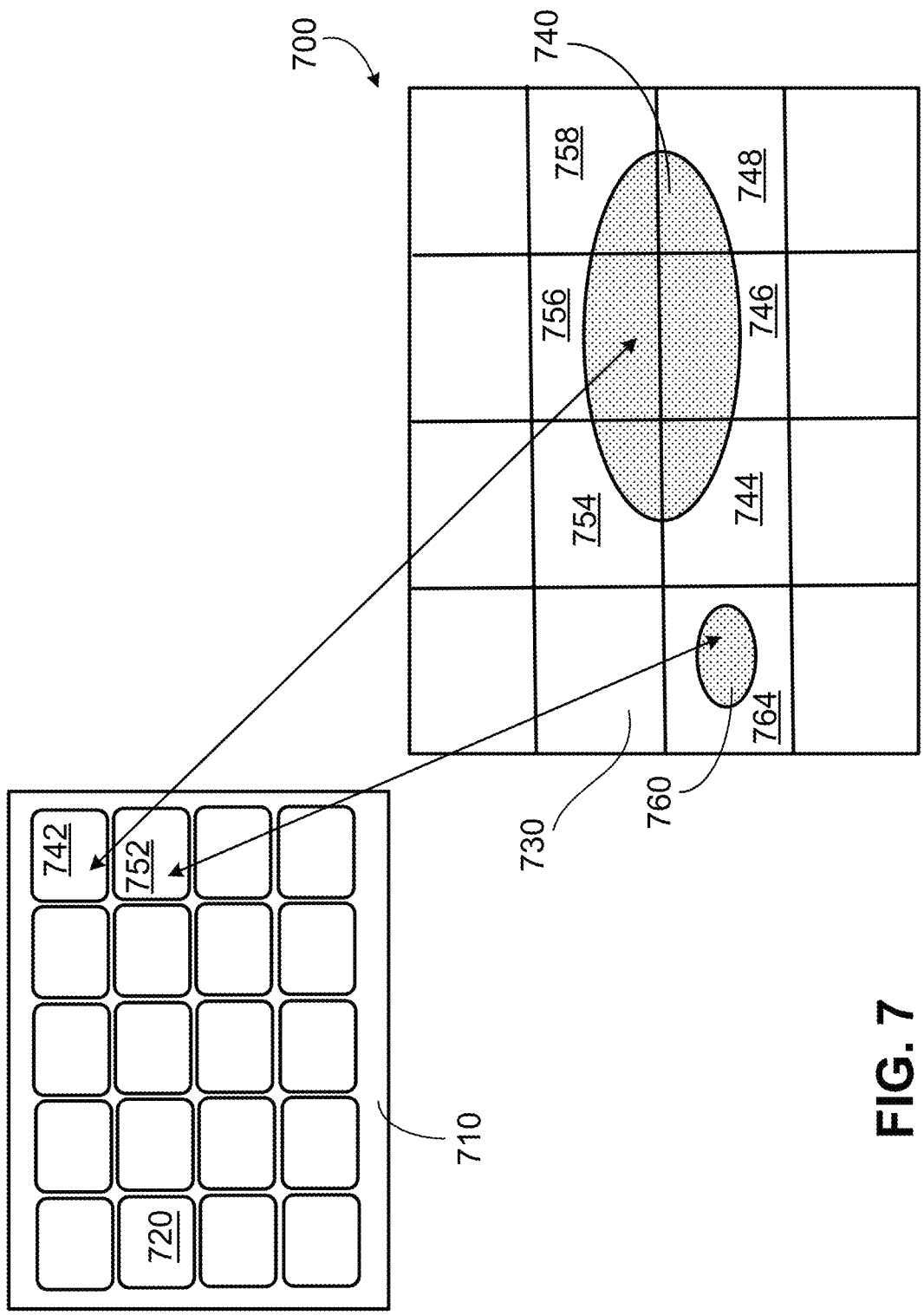
FIG. 7 is a schematic diagram illustrating parallel processing, according to an implementation.

FIG. 7 is a schematic diagram illustrating parallel processing, according to an implementation. As illustrated, basin domain 700 is divided into several subdomains (for example, subdomains 730, 764). In some implementations, each subdomain is associated with a data store. In some implantations, data store associated with a subdomain include data space to store information of external grid cells adjacent to the outer boundary cells of the subdomain. This data space can facilitate maintaining data coherency across subdomains for the purpose of determining parallel mass fluxes among subdomains.

In some implementations, operations performed for each subdomain is assigned to a computer processing core. In some implementations, a computer processing core can be responsible for operations of more than one subdomain. In FIG. 7, the processing core 720 is a processing core of parallel computing system 710. The processing core 720 is responsible for operations of subdomain 730. In some implementations, coherency of data across all subdomains is achieved via inter-processor communication methods.

In some implementations, each accumulating bodies (for example trap 740, 760) is assigned to a processing core. For example, processing core 742 is assigned to perform operations of trap 740, and processing core 752 is assigned to trap 760 operations. In some examples, a processing core responsible for a trap (for example, core 742) may be responsible for operations of a subdomain as well (for example subdomain 748). In some example, the core assignment is optimized to reduce process communication during parallel accumulation processing. For example, each subdomains covering one trap be assigned to the same core(s). An accumulating body may be covered completely by a subdomain (for example, trap 760 in subdomain 764), or may span over more than one subdomain (for example, trap 740 spans over subdomains 744, 746, 748, 754, 756, 758).

In some examples, the accumulation tip (for example, trap peak) of each trap is unique and belongs to only one subdomain. For example, a trap can span over multiple contiguous subdomains. In some examples, the subdomain that includes the accumulation tip is the trap's active subdomain. Accordingly, an active subdomain is a subdomain that contains the trap tip. In some examples, the trap tip is a grid cell on the trap's boundary and has the least hydrocarbon phase potential. In some implementations, backfilling advances locally in the trap and the trap continues to accumulate until the accumulation tip switches to another subdomain of the trap. In some examples, the backfilling is performed by peer-to-peer communication of the process core associated with the active subdomain coordinates with the process core associated with the trap.

Figure 8:
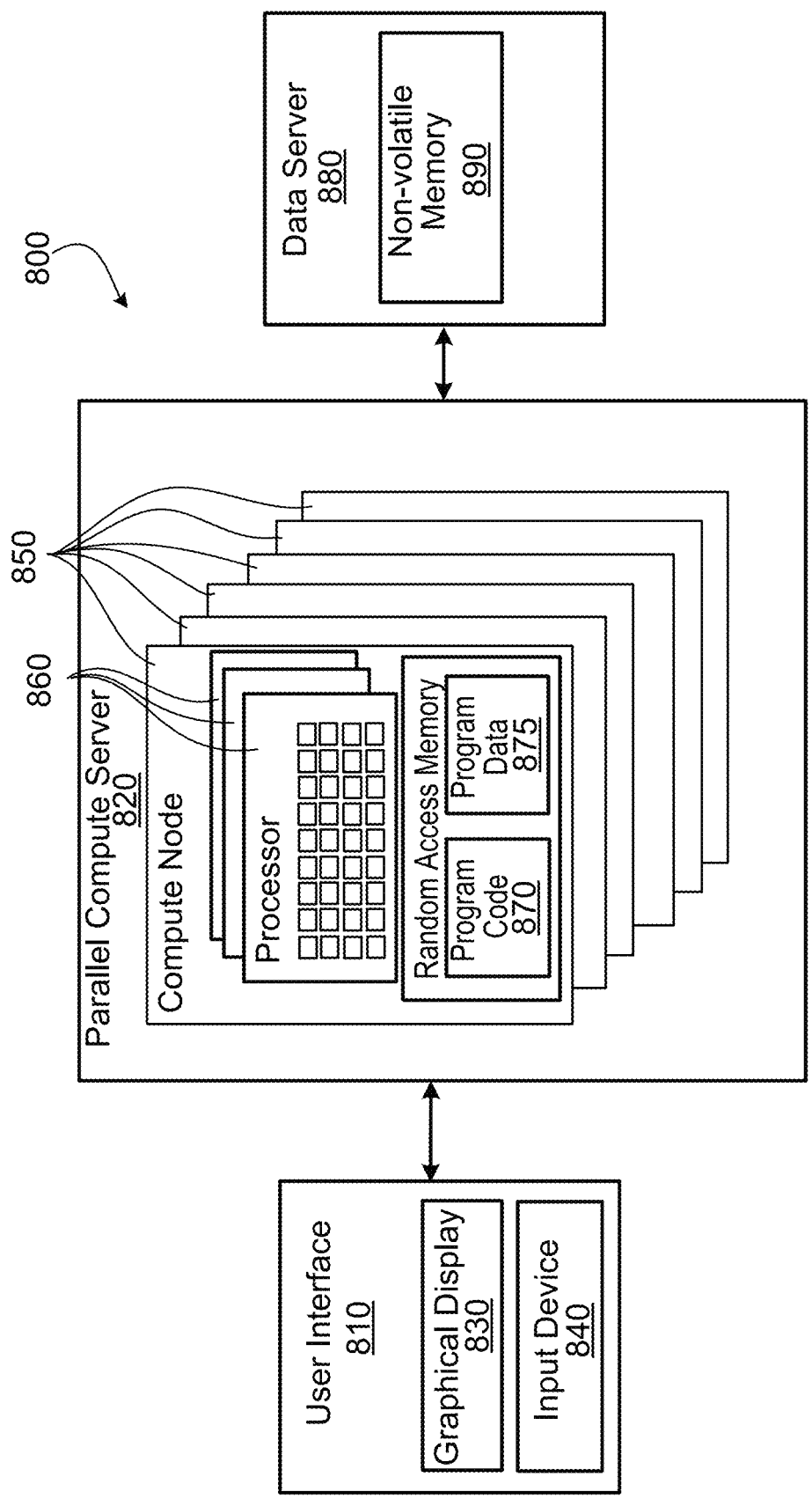
FIG. 8 illustrates a system that can execute implementations of the present disclosure.

FIG. 8 illustrates a system 800 that can execute implementations of the present disclosure. The system 800 may include a computing server 820 in communication with a data server 880, and a user interface 810. In some implementations, the user interface 810 includes a graphical display 830 for visualizing and analyzing input data and output results of the simulation. In some implementations, the user interface 810 contains a user entry device 840 to enable entry of modeling data.

In some implementations, the computing server 820 has several computing nodes 850 (for example computing system 710). Each computing nodes may have a random access memory (RAM) and processor 860. Processor 860 may contain several cores for computational operations on the program code 870 and program data 875. Some examples may use tens of thousands of computing cores to perform calculations for a large basin model. In some examples, these nodes are implemented on multiple computing devices and are in communication via a high-speed network, for example, an infiniband (which is a network with high (large) throughput and low (short) latency). In some implementations, data store in RAM may be distributed across multiple computing nodes. In some implementations, the computing processors, user interface, and data server may be in communication through a high-speed communication network. In some implementations, high-speed communication network may be included to communicate subdomain boundary data between processing cores such that data coherency amongst all the subdomains of the model is maintained. In some implementations, the data server 880 contains non-volatile memory 890 to store input data, program code, or simulation output.

The present method can handle hundreds of rock types or facies types and large order of magnitude of permeability variations (to the order of $10^{15}$). Each grid cell in the present method can have its own set of rock properties such as permeability, porosity, thermal conductivity, heat capacity, or any other relevant properties required for migration/ accumulation modeling. Moreover, any of the mentioned properties can vary over time, which provides a more realistic modeling as geological properties may change over time. Further, the time stepping and flow calculation are handled in a unified and consistent manner for all grid cells regardless of the cells' permeability values. This unified and consistent manner is distinct advantage over the traditional hybrid or combined methods. It is also superior to the flow-path, invasion percolation, and conventional Darcy-flow methods. Flow-path method and invasion-percolation method assume inviscid flow, wherein migration happens instantaneously. Neither flow-path method nor invasion percolation method can track hydrocarbon compositional variations in space and time. Traditional Darcy-flow method can treat viscous flow, but has severe time step size restriction due to numerical stability. Thus, only small models at low resolution can be simulated in that method.

Further, most of conventional commercially available migration modelings have primarily been accomplished via serial computational algorithms. Some components of the migration methods are very difficult to parallelize. The present disclosure includes parallel methods which may run a multi-billion-cell basin model in a matter of a few hours, with refined migration cell size which may be about 100 m (meter) horizontally and about 10 m vertically for the regional basin simulation. This capability affords higher resolution of a basin model to be run efficiently and affordably using conventional commodity high-performance-computing (HPC) hardware. The size and number of the grid cells in the present model is also much more refined than in commercially available models. (The spatial size of grid cell in commercially available basin models is typically 1 km horizontally and 100 m vertically; the typical model size is those models is about 10 million grid cells to 50 million grid cells, which is limited by computational cost and time.)

Test Cases

Described methods have been tested (in serial and in parallel) on several basin models of various model sizes, including models with hundreds of geological facies and millions (and even billions) of grid cells. Models with about tens of thousands of grid cells to about six billion grid cells using the present method and system have been simulated. The results of two of the test cases are included in this disclosure. Using these test examples, we show a validation of the parallel implementation, as well as the computational performance and scalability of the method. With this method, ultra-large basin simulations can be run in a matter of a few hours, thereby providing geoscientists and engineers with the enhanced capability to do high resolution migration simulation for basin modeling.

Test Case 1

Figure 9:
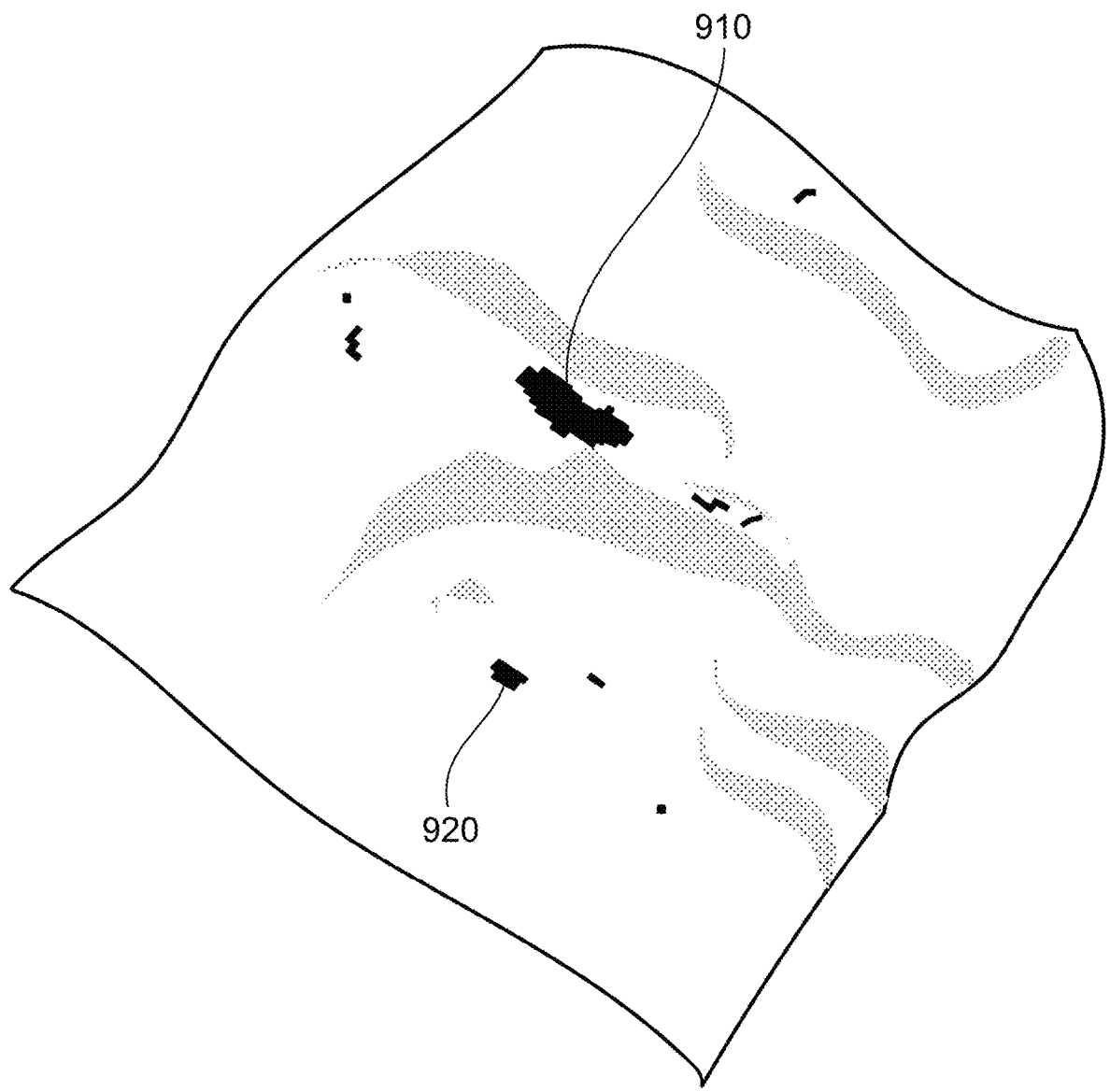
FIG. 9 is a plot illustrating results after running the Test Case 1 model, according to an implementation.

Test Case 1 consists of about 1.5 million grid cells (a grid of 135*135*82 cells) and includes 374 geological facies. The horizontal grid size is about 2 kilometers (km) and the simulation period is about 550 million years (ma). FIG. 1 illustrates an image of 3D facies map of this example model. The simulation time for running the simulation on this example was only a few minutes, which is more efficient than a few hours needed in traditional methods. FIG. 9 is a plot illustrating results after running the Test Case 1 model, according to an implementation. As illustrated, the final saturation map indicates trap accumulations (for example, 910, 920) underneath the seal rock.

Test Case 2

Figure 10:
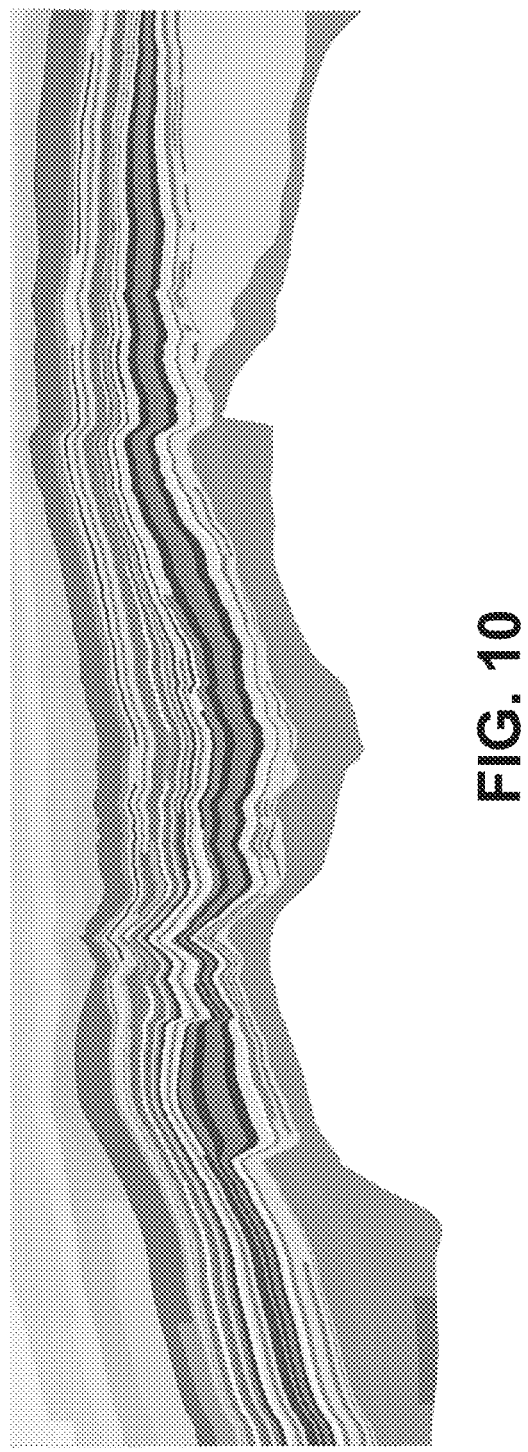
FIG. 10 is a plot illustrating a vertical cross-section of the Test Case 2 model facies, according to an implementation.
Figure 11:
FIG. 11 is a plot illustrating results after running the Test Case 2, according to an implementation.

Test Case 2 consists of about 5.8 billion grid cells (a grid of 4272*4032*325 cells) and includes 385 geological facies. The horizontal grid size is 250 meters (m) and the simulation period is about 550 ma. FIG. 10 is a plot illustrating a vertical cross-section of the Test Case 2 facies. With the help of parallel simulating according to the present disclosure, simulation time for this case was only a few hours. FIG. 11 is a plot illustrating results after running the Test Case 2, according to an implementation. As illustrated, a final saturation maps indicating various accumulations (for example, 1110, 1120) are modeled.

In a computer-implemented method, a simulation of hydrocarbon migration and accumulation in a subsurface formation (for example, medium) is performed with a basin simulator. The, basin domain may be partitioned into a plurality of subdomains, each subdomain representing a subset of the basin volume and being organized into a group of grid cells having data regarding HC fluids. The basin simulation is performed in a cluster computer formed of at least one master node being assigned a subdomain of the partitioned basin. Fluid characteristics parameters of interest for the grid cells are simulated.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

An action and a response may be temporally proximate such that an individual perceives the action and the response occurring substantially simultaneously. For example, the time difference for a response to display (or for an initiation of a display) of data following the individual's action to access the data may be less than 1 millisecond (ms), less than 1 second (sec.), or less than 5 secs. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, IOS, or any other suitable conventional operating system.

A computer program, which may also be referred to or described as a program, software, a software application, a module, a software module, a script, or code can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components, as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM), or both. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory, as appropriate) suitable for storing computer program instructions and data includes all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and CD-ROM, DVD+/−R, DVD-RAM, and DVD-ROM disks. The memory may store various objects or data, including caches, classes, frameworks, applications, backup data, jobs, web pages, web page templates, database tables, repositories storing dynamic information, and any other appropriate information including any parameters, variables, algorithms, instructions, rules, constraints, or references. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad, by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons. These and other UI elements may be related to or represent the functions of the web browser.

Implementations of the subject matter described in this specification can be implemented in a computing system that includes a back-end component, for example, as a data server, or that includes a middleware component, for example, an application server. The implementations can also be implemented in a computer system that includes a front-end component. For example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11a/b/g/n or 802.20 (or a combination of 802.11x and 802.20 or other protocols consistent with this disclosure), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of this disclosure or on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A computer-implemented method for simulating hydrocarbon (HC) migration and accumulation in a subsurface formation, comprising:
   determining, with one or more hardware processors, a plurality of HC mass associated with a plurality of grid cells representing the subsurface formation;
   determining, with the one or more hardware processors, a plurality of HC mass outflow magnitudes for one or more grid cells in the plurality of grid cells, the HC mass outflow magnitude for each of the one or more grid cells having an upper bound value based on the HC mass in that grid cell;
   updating, with the one or more hardware processors, the HC mass of the plurality of grid cells based on the plurality of HC mass outflow magnitudes;
   determining, with the one or more hardware processors, that a set of grid cells in the plurality of grid cells contain an excess mass of HC;
   in response to determining that a set of grid cells contain an excess mass of HC, performing, with the one or more hardware processors, an accumulation process to model filling of a trap associated with the set of grid cells;
   generating, with the one or more hardware processors, accumulation output data based on the accumulation process; and
   generating, with the one or more hardware processors, at least one flow control equipment command based on the accumulation output data.

2. The computer-implemented method of claim 1, wherein at least one grid cell of the trap is being filled, the at least one grid cell having a hydrocarbon potential that is less than hydrocarbon potential of neighboring grid cells adjacent to the at least one grid cell, the neighboring grid cells being outside the trap.

3. The computer-implemented method of claim 1, wherein the HC mass of the plurality of grid cells is being updated based on the plurality of HC mass outflow magnitude determined for a time step, the time step being determined based on net efflux and volume of the one or more grid cells.

4. The computer-implemented method of claim 1, wherein the magnitude of HC mass outflow of a grid cell is determined based on harmonic averaging of transmissibility of the grid cell and neighboring grid cells adjacent to the grid cell.

5. The computer-implemented method of claim 1, wherein the HC mass of the plurality of grid cells is being updated based on the plurality of HC mass outflow magnitude determined for a time step, the time step being determined based on properties of one or more chemical components of the HC.

6. The computer-implemented method of claim 1, wherein all grid cells in the trap have the same hydrocarbon potential.

7. The computer-implemented method of claim 1, wherein the hydrocarbon potential is calculated based on a gravity-capillary equilibrium in the trap.

8. A non-transitory, computer-readable medium storing one or more instructions of a computer-implemented method for simulating hydrocarbon (HC) migration and accumulation in a subsurface formation, the one or more instructions executable by a computer system to perform operations comprising:
  determining a plurality of HC mass associated with a plurality of grid cells representing the subsurface formation;
  determining a plurality of HC mass outflow magnitudes for one or more grid cells in the plurality of grid cells, the HC mass outflow magnitude for each of the one or more grid cells having an upper bound value based on the HC mass in that grid cell;
  updating the HC mass of the plurality of grid cells based on the plurality of HC mass outflow magnitudes;
  determining that a set of grid cells in the plurality of grid cells contain an excess mass of HC;
  in response to determining that a set of grid cells contain an excess mass of HC, performing an accumulation process to model filling of a trap associated with the set of grid cells;
  generating accumulation output data based on the accumulation process; and
  generating at least one flow control equipment command based on the accumulation output data.

9. The non-transitory, computer-readable medium of claim 8, wherein at least one grid cell of the trap is being filled, the at least one grid cell having a hydrocarbon potential that is less than hydrocarbon potential of neighboring grid cells adjacent to the at least one grid cell, the neighboring grid cells being outside the trap.

10. The non-transitory, computer-readable medium of claim 8, wherein the HC mass of the plurality of grid cells is being updated based on the plurality of HC mass outflow magnitude determined for a time step, the time step being determined based on net efflux and volume of the one or more grid cells.

11. The non-transitory, computer-readable medium of claim 8, wherein the magnitude of HC mass outflow of a grid cell is determined based on harmonic averaging of transmissibility of the grid cell and neighboring grid cells adjacent to the grid cell.

12. The non-transitory, computer-readable medium of claim 8, wherein the HC mass of the plurality of grid cells is being updated based on the plurality of HC mass outflow magnitude determined for a time step, the time step being determined based on properties of one or more chemical components of the HC.

13. The non-transitory, computer-readable medium of claim 8, wherein all grid cells in the trap have the same hydrocarbon potential.

14. The non-transitory, computer-readable medium of claim 8, wherein the hydrocarbon potential is calculated based on a gravity-capillary equilibrium in the trap.

15. A computer-implemented, parallel-processing system for simulating hydrocarbon (HC) migration and accumulation in a subsurface formation, the system comprising:
  a computer memory; and
  a hardware processor interoperably coupled with the computer memory and configured to perform operations comprising:
    determining a plurality of HC mass associated with a plurality of grid cells representing the subsurface formation;
    determining a plurality of HC mass outflow magnitudes for one or more grid cells in the plurality of grid cells, the HC mass outflow magnitude for each of the one or more grid cells having an upper bound value based on the HC mass in that grid cell;
    updating the HC mass of the plurality of grid cells based on the plurality of HC mass outflow magnitudes;
    determining that a set of grid cells in the plurality of grid cells contain an excess mass of HC;
    in response to determining that a set of grid cells contain an excess mass of HC, performing an accumulation process to model filling of a trap associated with the set of grid cells:
      generating accumulation output data based on the accumulation process; and
      generating at least one flow control equipment command based on the accumulation output data.

16. The computer-implemented, parallel-processing system of claim 15, wherein at least one grid cell of the trap is being filled, the at least one grid cell having a hydrocarbon potential that is less than hydrocarbon potential of neighboring grid cells adjacent to the at least one grid cell, the neighboring grid cells being outside the trap.

17. The computer-implemented, parallel-processing system of claim 15, wherein the HC mass of the plurality of grid cells is being updated based on the plurality of HC mass outflow magnitude determined for a time step, the time step being determined based on net efflux and volume of the one or more grid cells.

18. The computer-implemented, parallel-processing system of claim 15, wherein the magnitude of HC mass outflow of a grid cell is determined based on harmonic averaging of transmissibility of the grid cell and neighboring grid cells adjacent to the grid cell.

19. The computer-implemented, parallel-processing system of claim 15, wherein the HC mass of the plurality of grid cells is being updated based on the plurality of HC mass outflow magnitude determined for a time step, the time step being determined based on properties of one or more chemical components of the HC.

20. The computer-implemented, parallel-processing system of claim 15, wherein all grid cells in the trap have the same hydrocarbon potential calculated based on a gravity-capillary equilibrium in the trap.

* * * * *

UNITED STATES PATENT AND TRADEMARK OFFICE
CERTIFICATE OF CORRECTION

PATENT NO. : 10,650,175 B2
APPLICATION NO. : 16/256019
DATED : May 12, 2020
INVENTOR(S) : Larry Siu-Kuen Fung and Shouhong Du Page 1 of 1

It is certified that error appears in the above-identified patent and that said Letters Patent is hereby corrected as shown below:

In the Claims

Column 24, Line 32, Claim 15, delete "cells:" and insert -- cells; --.

Signed and Sealed this
Fourteenth Day of July, 2020

Andrei Iancu
*Director of the United States Patent and Trademark Office*